United States Patent [19]

McClure

[11] Patent Number: 5,389,577
[45] Date of Patent: Feb. 14, 1995

[54] LEADFRAME FOR INTEGRATED CIRCUITS

[75] Inventor: David C. McClure, Carrollton, Tex.

[73] Assignee: SGS-Thomson Microelectronics, Inc., Carrollton, Tex.

[21] Appl. No.: 180,692

[22] Filed: Jan. 13, 1994

Related U.S. Application Data

[63] Continuation of Ser. No. 938,396, Aug. 31, 1992, abandoned.

[51] Int. Cl.6 .............................................. H01L 21/60
[52] U.S. Cl. .................................... 437/206; 437/209; 437/214; 437/217; 437/220
[58] Field of Search ............... 437/206, 207, 209, 217, 437/220, 214, 219; 257/676

[56] References Cited

U.S. PATENT DOCUMENTS

| | | | |
|---|---|---|---|
| 4,298,883 | 11/1981 | Komatsu et al. | 437/220 |
| 4,410,905 | 10/1983 | Grabbe | 437/220 |
| 4,612,564 | 9/1986 | Moyer | 257/676 |
| 5,021,864 | 6/1991 | Kelly et al. | 437/220 |

*Primary Examiner*—Brian E. Hearn
*Assistant Examiner*—Kevin M. Picardat
*Attorney, Agent, or Firm*—Kenneth C. Hill; Lisa K. Jorgenson; Richard K. Robinson

[57] ABSTRACT

A lead frame having a paddle for attaching a die thereon. The paddle comprises at least two separate segments for attaching to the die. Each segment can be connected to an input lead, such as a power supply, and provide several locations for bonding to the die.

10 Claims, 1 Drawing Sheet

LEADFRAME FOR INTEGRATED CIRCUITS

This is a continuation of application Ser. No. 07/938,396, filed Aug. 31, 1992, now abandoned.

BACKGROUND OF THE INVENTION

1. Field of the Invention

The present invention relates generally to integrated circuits, and more particularly to packaging integrated circuits. Still more particularly, the present invention relates to a leadframe for attaching a die thereon for use in an integrated circuit.

2. Description of the Prior Art

The process of packaging integrated circuits includes the step of attaching dies to leadframes. A leadframe includes, among other components, paddles for attaching the dies thereon. The dies can be attached to the paddles with an epoxy adhesive or an eutectic layer.

Typically, the paddles are formed as a single support pad on which the dies are attached. In order to supply the various circuits within the die with a supply voltage, it is necessary to bus the power supply voltage from a bond pad to all parts of the die. As known in the art, wide signal lines are required to bus a power supply voltage from one end of a die to the other. The wide signal lines reduce the amount of available space on the integrated circuit. This reduction of available space is a problem as the density of integrated circuits continues to increase.

Another problem caused by the wide signal lines relates to their resistance, parasitic capacitance and inductance. With integrated circuits operating at high speeds and lower supply voltages, the signal lines used to bus power supplies need to be proportionally larger to insure the proper supply voltage is accessible across the die. This exacerbates the problem of reduced available space in the integrated circuit.

Therefore, it would be desirable to provide a leadframe structure which minimizes the bussing of supply voltages across a die. It is also desirable that such a leadframe structure not significantly increase the complexity of the packaging process of integrated circuits.

SUMMARY OF THE INVENTION

A lead frame having a paddle for attaching a die thereon. The paddle comprises at least two separate segments for attaching to the die. Each segment can be connected to an input lead, such as a power supply, and provide several locations for bonding to the die.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
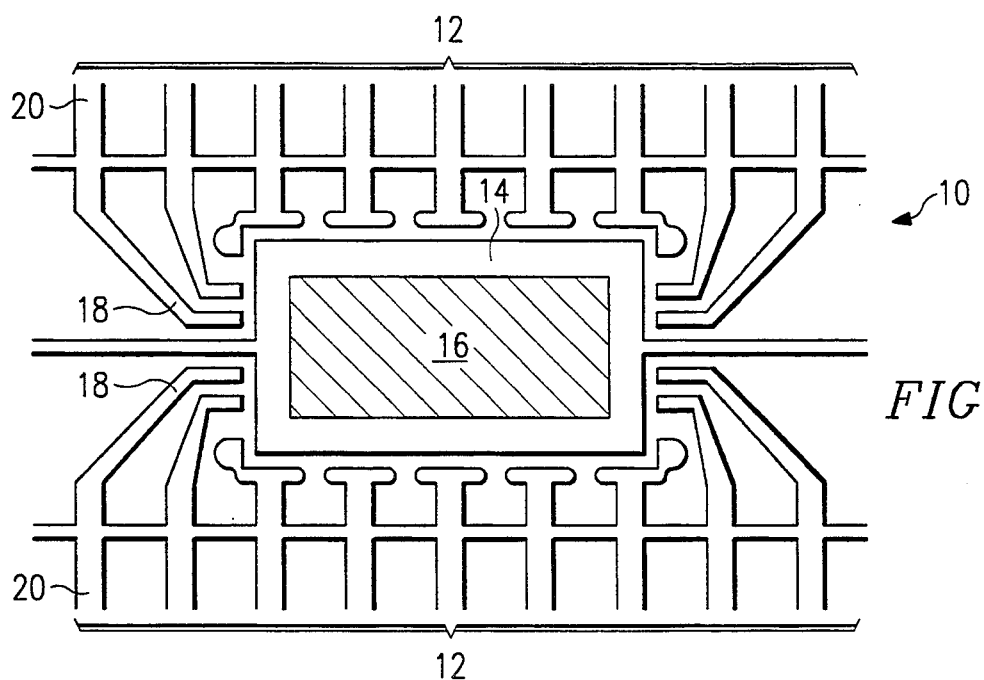
FIG. 1 illustrates a top view of a portion of a leadframe strip containing a semiconductor die according to the prior art.

Referring to FIG. 1, a top view of a portion of a leadframe strip containing a semiconductor die is illustrated according to the prior art. The leadframe 10 contains a plurality of leads 12 and a paddle 14. Attached to the paddle 14 is a die 16.

Each of the plurality of leads 12 is comprised of an interior portion 18 and an exterior portion 20. As known in the art, the interior portion 18 will be attached to the die 16 in subsequent processing steps. The exterior portion 20 will extend outside of the integrated circuit package and be used to connect external inputs or devices with the various circuits in the integrated circuit.

Those skilled in the art will recognize that the interior portion 18 can be attached to the die 16 with wires, a process known as ball bonding. An alternative technique for attaching the interior portion 18 to the die 16 is to bond the interior portion 18 directly onto the die 16 itself, a process known as beam-lead bonding. One possible way to utilize beam-lead bonding in the present invention is to bond the leads onto the die and then ball bond a wire from the power supply bonding pad or lead to one of the segments of the paddle. An alternative technique is to have a split lead, so that a part of the lead bonds to the bonding pad on the die and another part of the lead makes contact with the paddle. Finally, another alternative is to have a split lead, where one part of the lead attaches to the die and another part of the lead is bent below the die to act as a support and paddle for the die.

Figure 2:
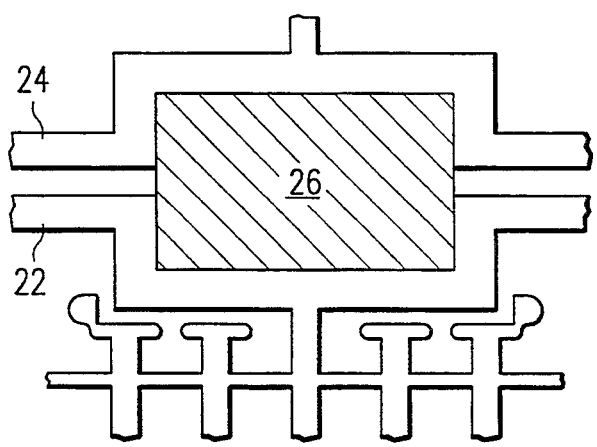
FIG. 2 illustrates a top view of a portion of a leadframe strip containing a semiconductor die according to the present invention.

FIG. 2 illustrates a top view of a portion of a leadframe strip containing a die according to the present invention. The leadframe strip depicted in FIG. 2 is one design of a leadframe, and those skilled in the art will recognize that other leadframe designs exist and can be used in conjunction with this invention. As can be seen, the paddle is comprised of a first segment 22 and a second segment 24. A die 26 is attached to a portion of both segments 22, 24. In the preferred embodiment, die 26 is attached to segments 22,24 with a non-conductive adhesive material. However, conductive adhesive material can be used.

If conductive adhesive material is used, care would need to be taken to ensure the conductive adhesive material does not electrically connect both of the segments 22, 24 together. The conductive adhesive material should be placed on each segment separately, as opposed to the bottom of the die, when attaching the die to the segments 22, 24. In addition, with certain types of conductive material the resistance between the paddle and the die is diodic in nature if the substrate is an n-doped substrate. In other words, the paddle is located at one terminal of a diode, and the die is located at the other terminal of the diode. As a result, a substrate biased at $V_{cc}$ will leave a paddle biased at $V_{ss}$ reversed biased.

Because segments 22, 24 are separate and distinct pieces, segment 22 and segment 24 can carry different signals. For example, segment 22 can be tied to power supply $V_{cc}$, and segment 24 can be tied to $V_{ss}$. Now $V_{ss}$ and $V_{cc}$ are available for bonding to the die 26 at both ends of die 26. This minimizes the need to bus these signals completely across die 26. Advantages to not bussing a signal across die 26 include reduced signal line resistance, reduced inductance and parasitic capacitance. It also increases the amount of available space on the integrated circuit, since bussing signal lines need to be wide. As a result, smaller and faster integrated circuits can be manufactured.

Figure 3:
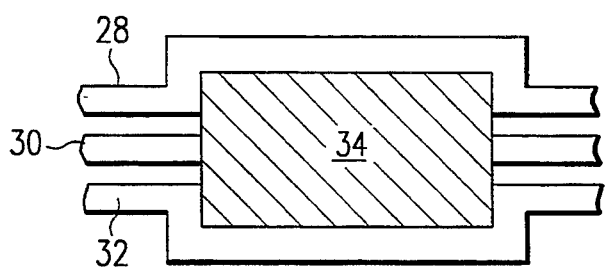
FIG. 3 illustrates a top view of a portion of an alternative leadframe strip containing a semiconductor die according to the present invention.

Referring to FIG. 3, a top view of a portion of an alternative leadframe strip containing a semiconductor die is illustrated according to the present invention. The paddle is comprised of a first segment 28, a second segment 30, and a third segment 32. Each segment is separate and distinct from the other segments. A die 34 is attached to a portion of first segment 28, second segment 30, and third segment 32. As discussed in reference to FIG. 2, each segment can be tied to a different input or output voltage.

Figure 4:
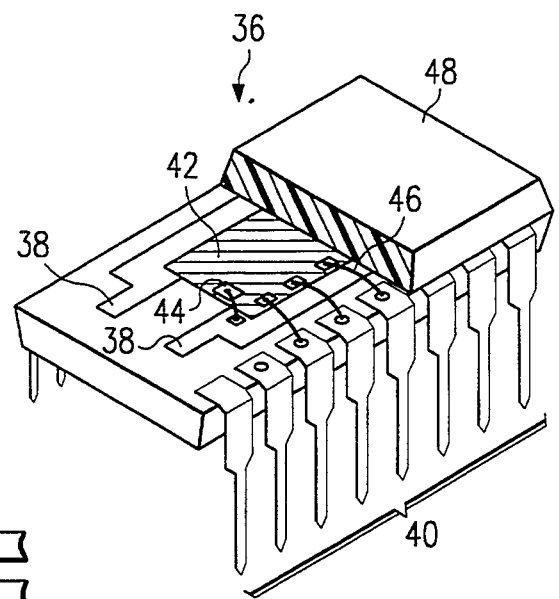
FIG. 4 illustrates a perspective cut-away view of a completed integrated circuit package according to the present invention.

FIG. 4 illustrates a perspective cut-away view of a completed integrated circuit package according to the present invention. The integrated circuit package 36 includes a leadframe containing a paddle 38 and a plurality of leads 40. A die 42 is attached to the paddle 38. In the preferred embodiment, the plurality of leads 40 are attached by wires 46 to bonding pads 44 on the die 42. An alternative technique is to attach the leads 40 directly to die 42, as discussed above.

As can be seen, bonding pads 44 are placed at several locations around die 42. And, because the two segments of paddle 38 can be connected to power supplies in the preferred embodiment, bonding pads 44 can be placed at strategic places on the die so that a power supply signal does not have to be bussed to all parts of die 42. At most, a power supply signal would now have to be bussed across only half of die 42. Finally, a plastic package 48 encapsulates the paddle 38, die 42, wires 46, and a portion of the leads 40 to form the integrated circuit package 36.

As will be appreciated by those skilled in the art, the invention described above minimizes the need to bus a power signal the entire length of a die. This reduces the inductance, parasitic capacitance and resistance of bussing signal lines, as well as increases the amount of available space on the integrated circuit. As a result, smaller and faster integrated circuits can be fabricated.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a leadframe for an integrated circuit, comprising the steps of:
   forming the leadframe having a paddle for attaching a die thereon, and having a plurality of leads extending from the paddle, wherein said paddle comprises at least two substantially rectangular shaped separate segments having a substantially rectangular space separating each segment from the remaining segments;
   attaching said die directly to said separate segments of said paddle with an adhesive material;
   electrically bonding each separate segment of the paddle to the die, wherein each separate segment can transmit a different electrical signal to or from the die; and
   bonding the plurality of leads to the die so that electrical contact can be made between the plurality of leads and the die.

2. The method of claim 1, wherein said step of attaching the die to the separate segments of the paddle comprises attaching the die to the separate segments with non-conductive adhesive material.

3. The method of claim 1, wherein said step of attaching the die to the separate segments of the paddle comprises attaching the die to the separate segments with conductive adhesive material.

4. The method of claim 1, wherein said step of bonding the plurality of leads to the die comprises attaching bonding wires from the plurality of leads to bonding pads on the die.

5. The method of claim 1, wherein said step of bonding the plurality of leads to the die comprises bonding the plurality of leads directly to bonding pads on the die.

6. The method of claim 1, wherein said step of forming the leadframe having a paddle for attaching a die thereon comprises the step of forming the leadframe having a paddle for attaching a die thereon wherein said paddle comprises at least three separate segments.

7. A method for fabricating a leadframe for an integrated circuit, comprising the steps of:
   forming the leadframe having a paddle for attaching a die thereon, and having a plurality of leads extending from the paddle, wherein said paddle comprises at least three separate segments;
   attaching said die directly to each of said separate segments of said paddle with an adhesive material;
   electrically bonding each separate segment of the paddle to the die, wherein each separate segment can transmit a different electrical signal to or from the die; and
   bonding the plurality of leads to the die so that electrical contact can be made between the plurality of leads and the die.

8. The method of claim 7, wherein said step of attaching the die to the separate segments of the paddle comprises attaching the die to the separate segments of the paddle with a non-conductive adhesive material.

9. The method of claim 7, wherein said step of attaching the die to the separate segments of the paddle comprises attaching the die to the separate segments of the paddle with a conductive adhesive material.

10. The method of claim 7, wherein said step of bonding the plurality of leads to the die comprises attaching bonding wires from the plurality of leads to bonding pads on the die.

* * * * *